(12) United States Patent
Shimizu et al.

(10) Patent No.: US 9,167,692 B2
(45) Date of Patent: Oct. 20, 2015

(54) WIRING BOARD, SEMICONDUCTOR DEVICE, AND METHOD OF MANUFACTURING WIRING BOARD

(71) Applicant: SHINKO ELECTRIC INDUSTRIES CO., LTD., Nagano-ken (JP)

(72) Inventors: Noriyoshi Shimizu, Nagano (JP); Toshinori Koyama, Nagano (JP); Akio Rokugawa, Nagano (JP)

(73) Assignee: Shinko Electric Industries Co., Ltd., Nagano-ken (JP)

(*) Notice: Subject to any disclaimer, the term of this patent is extended or adjusted under 35 U.S.C. 154(b) by 0 days.

(21) Appl. No.: 14/317,529

(22) Filed: Jun. 27, 2014

(65) Prior Publication Data

US 2015/0001738 A1  Jan. 1, 2015

(30) Foreign Application Priority Data

Jul. 1, 2013  (JP) .................................. 2013-138202

(51) Int. Cl.
*H01L 23/48* (2006.01)
*H01L 23/52* (2006.01)
*H01L 29/40* (2006.01)
*H05K 1/11* (2006.01)
*H05K 1/18* (2006.01)
*H01L 23/498* (2006.01)
*H01L 21/48* (2006.01)

(52) U.S. Cl.
CPC .............. *H05K 1/115* (2013.01); *H01L 21/486* (2013.01); *H01L 21/4857* (2013.01); *H01L 23/49822* (2013.01); *H01L 23/49827* (2013.01); *H05K 1/181* (2013.01); *H01L 23/49866* (2013.01); *H01L 2224/16225* (2013.01); *H01L 2224/32225* (2013.01); *H01L 2224/73204* (2013.01); *H01L 2924/15311* (2013.01)

(58) Field of Classification Search
USPC .................................................. 257/774, 778
See application file for complete search history.

(56) References Cited

U.S. PATENT DOCUMENTS 8,797,757 B2 * 8/2014 Kaneko et al. ................. 361/767
2012/0175153 A1 * 7/2012 Kaneko et al. ................. 174/251

FOREIGN PATENT DOCUMENTS

JP  2003-023252  1/2003
JP  2003-023253  1/2003

* cited by examiner

*Primary Examiner* — Telly Green
(74) *Attorney, Agent, or Firm* — Fish & Richardson P.C.

(57) ABSTRACT

A wiring board includes a first via hole in a first insulating layer to expose a first wiring layer. A first via in the first via hole includes an end surface. A second wiring layer is arranged on the first insulating layer and the end surface of the first via. A second insulating layer covers the second wiring layer. A second via hole in the second insulating layer exposes the second wiring layer. A second via in the second via hole is arranged above the first via through the second wiring layer. The outer surface of the first insulating layer is lower in surface roughness than an inner surface of the first via hole.

12 Claims, 15 Drawing Sheets

WIRING BOARD, SEMICONDUCTOR DEVICE, AND METHOD OF MANUFACTURING WIRING BOARD

CROSS-REFERENCE TO RELATED APPLICATIONS

This application is based upon and claims the benefit of priority from prior Japanese Patent Application No. 2013-138202, filed on Jul. 1, 2013, the entire contents of which are incorporated herein by reference.

FIELD

The present disclosure relates to a wiring board.

BACKGROUND

Japanese Laid-open Patent Application Nos. 2003-023252 and 2003-023253 describe a wiring board with a multilayer wiring formed by buildup technique. According to the buildup technique, formation of an insulating layer, formation of a via hole, and formation of a wiring using electrolytic plating are repeated to form the multilayer wiring.

In response to trend in recent years toward higher performance of an electronic part such as a semiconductor chip, efforts are being made to make a wiring layer of a wiring board finer on which the electronic part is to be mounted.

SUMMARY

According to formation of a multilayer wiring using a semiadditive process, a via hole is formed with a laser in an insulating layer on a wiring layer. Before a via is formed in the via hole, a desmearing process is performed to remove resin smears in the via hole. This desmearing process etches the insulating layer to roughen the insulating layer. The roughened surface of the insulating layer has anchor effect and this anchor effect enhances adhesion between the insulating layer and a wiring layer on the insulating layer. However, roughening the insulating layer in turn becomes an obstacle to formation of a fine wiring layer on the roughened surface of the insulating layer. As an example, where narrow-pitch wiring layers are to be formed on the insulating layer, recesses and projections in the roughened surface of the insulating layer make the occurrence of residues likely during etching of a seed layer, so that a short circuit may occur easily between the wiring layers. The inventor of the present application found that it is difficult to achieve both roughening an insulating layer and forming fine wiring layers (wiring layers of a narrow pitch).

One aspect of the present disclosure is a wiring board including a first wiring layer; a first insulating layer covering the first wiring layer; a first via hole having an opening in an outer surface of the first insulating layer, an outer surface of the first wiring layer being exposed through the first via hole; a first via filling in the first via hole, the first via including an end surface exposed at the outer surface of the first insulating layer; a second wiring layer arranged on the outer surface of the first insulating layer and the end surface of the first via; a second insulating layer covering the second wiring layer; a second via hole having an opening in an outer surface of the second insulating layer, the outer surface of the second wiring layer being exposed through the second via hole; and a second via filling in the second via hole, the second via being smaller in diameter than the first via, the second via being arranged above the first via through the second wiring layer, wherein the outer surface of the first insulating layer is lower in surface roughness than an inner surface of the first via hole.

Other aspects and advantages of the present invention will become apparent from the following description, taken in conjunction with the accompanying drawings, illustrating by way of example the principles of the invention.

BRIEF DESCRIPTION OF DRAWINGS

The invention, together with objects and advantages thereof, may best be understood by reference to the following description of the presently preferred embodiments together with the accompanying drawings in which.

DESCRIPTION OF EMBODIMENTS

A wiring board according to an embodiment is described by referring to FIGS. 1 to 13B.

Figure 1A:
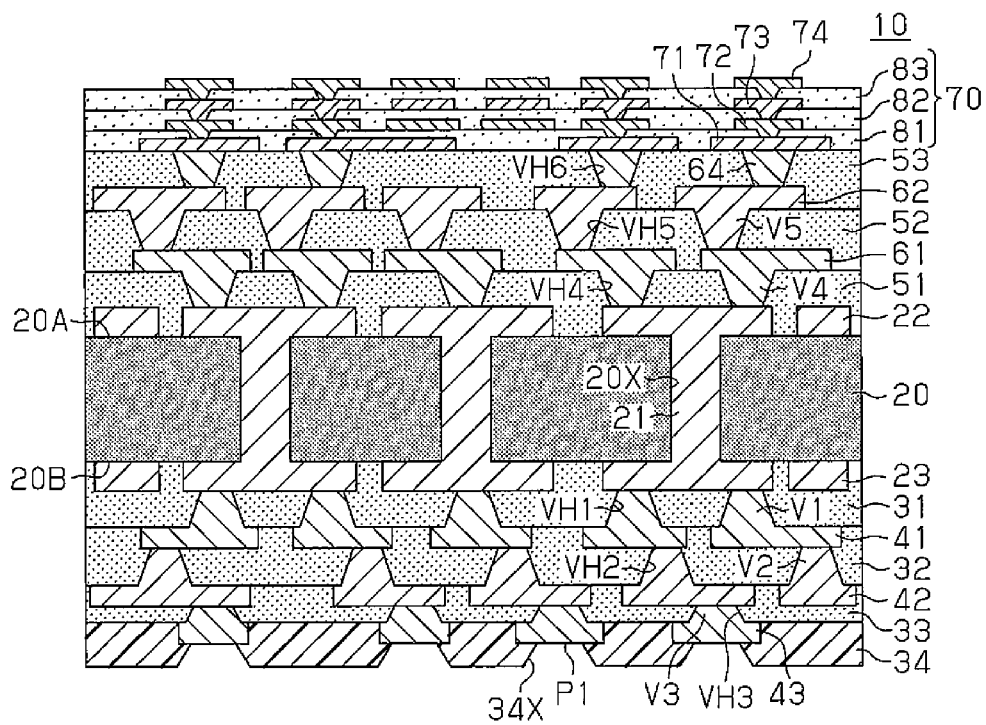
FIG. 1A is a cross sectional view illustrating an outline of a wiring board according to an embodiment.

As illustrated in FIG. 1A, a wiring board 10 includes a core substrate 20 in an intermediate part of the thickness direction of the wiring board 10. The core substrate 20 may be what is called a glass epoxy substrate formed by impregnating glass cloth (glass woven fabric) as a reinforcement material with a thermosetting insulating resin mainly containing an epoxy resin and curing the insulating resin. The reinforcement material is not limited to glass cloth but it may be glass nonwoven fabric, aramid woven fabric, aramid nonwoven fabric, liquid crystal polymer (LCP) woven fabric or LCP nonwoven fabric, for example. The thermosetting insulating resin is not limited to an epoxy resin but it may be a resin material such as a polyimide resin or a cyanate resin. The core substrate 20 may have a thickness of from about 80 μm to about 800 μm, for example.

At least one through hole 20X is formed in the core substrate 20. Three through holes 20X are illustrated in FIG. 1A. A penetrating electrode 21 in the through hole 20X penetrates the core substrate 20 in the thickness direction of the core substrate 20. The penetrating electrode 21 may be a circular cylinder filling in the through hole 20X. The penetrating electrode 21 may have a diameter of from about 50 μm to about 100 μm, for example. The penetrating electrode 21 may be made of a material such as copper (Cu) or a copper alloy, for example.

A wiring layer 22 is formed on a top surface 20A of the core substrate 20. A wiring layer 23 is formed on a bottom surface 20B of the core substrate 20. The wiring layers 22 and 23 are electrically connected to each other through the penetrating electrode 21. The wiring layers 22 and 23 may be made of a material such as copper or a copper alloy, for example. The wiring layers 22 and 23 may each have a thickness of from about 15 μm to about 35 μm, for example.

An insulating layer 31, a wiring layer 41, an insulating layer 32, and a wiring layer 42 are piled in the order named over the bottom surface 20B of the core substrate 20. The insulating layer 31 covers the wiring layer 23. The wiring layer 41 is arranged on the bottom surface of the insulating layer 31. The insulating layer 32 covers the wiring layer 41. The wiring layer 42 is arranged on the bottom surface of the insulating layer 32. An insulating layer 33, a wiring layer 43, and a solder resist layer 34 are piled in the order named over the bottom surface of the insulating layer 32. The insulating layer 33 covers the wiring layer 42. The wiring layer 43 is arranged on the bottom surface of the insulating layer 33. The solder resist layer 34 is arranged on the bottom surface of the insulating layer 33 so as to cover part of the wiring layer 43.

The insulating layer 31 is given via holes VH1 formed in required positions and passing through the insulating layer 31 in the thickness direction of the insulating layer 31. Vias V1 electrically connecting the wiring layers 23 and 41 are formed in the via holes VH1. The vias V1 are formed to fill in the via holes VH1. The insulating layer 32 is given via holes VH2 formed in required positions and passing through the insulating layer 32 in the thickness direction of the insulating layer 32. Vias V2 electrically connecting the wiring layers 41 and 42 are formed in the via holes VH2. The vias V2 are formed to fill in the via holes VH2. The insulating layer 33 is given via holes VH3 formed in required positions and passing through the insulating layer 33 in the thickness direction of the insulating layer 33. Vias V3 electrically connecting the wiring layers 42 and 43 are formed in the via holes VH3. The vias V3 are formed to fill in the via holes VH3. The via holes VH1, the via holes VH2, the via holes VH3, the vias V1, the vias V2, and the vias V3 are each formed into a tapered shape with a diameter increasing from a top side (on the part of the core substrate 20) to a bottom side (on the part of the wiring layer 43) as depicted in FIG. 1A. As an example, the via holes VH1, the via holes VH2, and the via holes VH3 are each formed into a truncated cone shape with an opening diameter of a top opening end smaller than an opening diameter of a bottom opening end. The vias V1, the vias V2, and the vias V3 are each formed into a truncated cone shape with a top surface smaller in diameter than a bottom surface.

The wiring layers 41, 42 and 43 may each have a thickness of from about 15 μm to about 20 μm, for example. A thickness from the bottom surface of the wiring layer 23 to the bottom surface of the insulating layer 31, a thickness from the bottom surface of the wiring layer 41 to the bottom surface of the insulating layer 32, and a thickness from the bottom surface of the wiring layer 42 to the bottom surface of the insulating layer 33, may each be from about 15 μm to about 35 μm, for example. The wiring layers 41, 42 and 43, the vias V1, the vias V2, and the vias V3 may each be made of a material such as copper or a copper alloy, for example. The insulating layers 31, and 32 and 33 may each be made of an insulating resin material such as an epoxy resin or a polyimide resin, or a resin material formed by mixing a silica or alumina filler into either of these resins. The insulating layers 31, 32 and 33 may each be made of an insulating resin with thermosetting properties, for example. When a thermosetting resin is used to form the insulating layers 31, 32 and 33, it is preferable that a non-photosensitive thermosetting resin is used as the thermosetting resin.

The solder resist layer 34 is given openings 34X through which parts of the bottommost wiring layer 43 are exposed and the exposed parts function as external connection pads P1. The external connection pads P1 are to be connected to external connection terminals 96 (see FIG. 3) such as solder balls or lead pins used for mounting the wiring board 10 on a mounting substrate such as a mother board. Where necessary, an organic solderability preservative (OSP) process may be performed on areas of the wiring layer 43 exposed through the openings 34X to form OSP films and the external connection terminals 96 may be connected to the OSP films. Alternatively, metallic layers may be formed on the areas of the wiring layer 43 exposed through the openings 34X and the external connection terminals 96 may be connected to these metallic layers. Examples of the metallic layers include a gold (Au) layer, a nickel (Ni)/Au layer (a metallic layer formed by piling an Ni layer and an Au layer in this order), and an Ni/palladium (Pd)/Au layer (a metallic layer formed by piling an Ni layer, a Pd layer, and an Au layer in this order). The Ni layer, the Au layer, and the Pd layer mentioned herein may each be a metallic layer formed by electroless plating (electroless plated metallic layer), for example. The aforementioned Ni layer is a metallic layer made of Ni or an Ni alloy. The aforementioned Au layer is a metallic layer made of Au or an Au alloy. The aforementioned Pd layer is a metallic layer made of Pd or a Pd alloy. The areas of the wiring layer 43 themselves (or the OSP films themselves or the metallic layers themselves if the OSP films or the metallic layers are formed on the wiring layer 43) exposed through the openings 34X may be used as external connection terminals.

A planar shape of each of the openings 34X and the external connection pads P1 may for example be a circle that may have a diameter of from about 200 μm to about 300 μm, for example. A thickness from the bottom surface of the wiring layer 43 to the bottom surface of the solder resist layer 34 may be from about 20 μm to about 40 μm, for example. The solder resist layer 34 may be made of an insulating resin material such as an epoxy resin or an acrylic resin, for example.

An insulating layer 51, a wiring layer 61, an insulating layer 52, a first wiring layer 62, and a first insulating layer 53 are piled in the order named over the top surface 20A of the core substrate 20. The insulating layer 51 covers the wiring layer 22. The wiring layer 61 is arranged on the top surface of the insulating layer 51. The insulating layer 52 covers the wiring layer 61. The first wiring layer 62 is arranged on the top surface of the insulating layer 52. The first insulating layer 53 covers the first wiring layer 62.

The insulating layer 51 is given via holes VH4 formed in required positions and passing through the insulating layer 51 in the thickness direction of the insulating layer 51. Vias V4 electrically connecting the wiring layers 22 and 61 are formed in the via holes VH4. The vias V4 are formed to fill in the via holes VH4. The insulating layer 52 is given via holes VH5 formed in required positions and passing through the insulating layer 52 in the thickness direction of the insulating layer 52. Vias V5 electrically connecting the wiring layer 61 and the first wiring layer 62 are formed in the via holes VH5. The vias V5 are formed to fill in the via holes VH5. The via holes VH4, the via holes VH5, the vias V4, and the vias V5 are each formed into a tapered shape with a diameter increasing from a bottom side (on the part of the core substrate 20) to a top side as depicted in FIG. 1A. As an example, the via holes VH4 and the via holes VH5 are each formed into a truncated cone shape with an opening diameter of a top opening end larger than an opening diameter of a bottom opening end. The vias V4 and the vias V5 are each formed into a truncated cone shape with a top surface larger in diameter than a bottom surface.

Figure 1B:
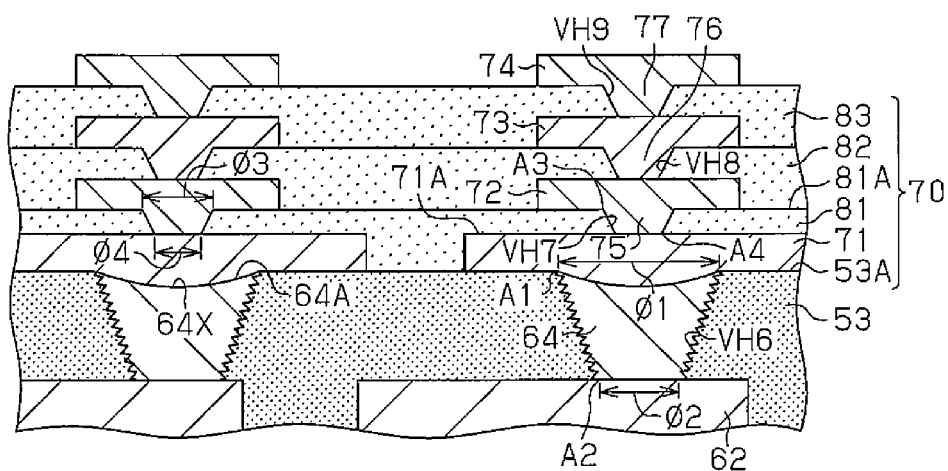
FIG. 1B is a cross sectional view illustrating part of FIG. 1A in an enlarged manner.

The wiring layers 61 and 62 may each have a thickness of from about 15 μm to about 20 μm, for example. A thickness from the top surface of the wiring layer 22 to the top surface of the insulating layer 51, a thickness from the top surface of the wiring layer 61 to the top surface of the insulating layer 52, and a thickness from the top surface of the first wiring layer 62 to the top surface of the first insulating layer 53, may each be from about 15 μm to about 35 μm, for example. The wiring layers 61 and 62, the vias V4, and the vias V5 may each be made of a material such as copper or a copper alloy, for example. The insulating layers 51, 52 and 53 may each be made of an insulating resin material such as an epoxy resin or a polyimide resin, or a resin material formed by mixing a silica or alumina filler into either of these resins. The insulating layers 51, 52 and 53 may each be made of an insulating resin with thermosetting properties, for example. When a thermosetting resin is used to form the insulating layers 51, 52 53, it is preferable that a non-photosensitive thermosetting resin is used as the thermosetting resin. As depicted in FIG. 1B, the first insulating layer 53 is given first via holes VH6 that form openings in required positions of a top surface 53A of the first insulating layer 53. The first via holes VH6 pass through the first insulating layer 53 in the thickness direction of the first insulating layer 53 to expose parts of the top surface (surface) of the first wiring layer 62. The first via holes VH6 are each formed into a tapered shape with a diameter increasing from a bottom side (on the part of the first wiring layer 62) to a top side (on the part of the top surface 53A of the first wiring layer 53) as depicted in FIG. 1B. As an example, the first via holes VH6 are each formed into a truncated cone shape with an opening diameter Ø1 of a top opening end A1 larger than an opening diameter Ø2 of a bottom opening end A2. In this case, the first via holes VH6 are each formed into a substantially inverted trapezoidal shape in cross sectional view and a substantially circular shape in plan view.

The first via holes VH6 may each have a depth of from about 15 μm to about 35 μm, for example. The opening diameter Ø1 of each of the first via holes VH6 may be from about 50 μm to about 60 μm, for example. The opening diameter Ø2 of each of the first via holes VH6 may be from about 40 μm to about 50 μm, for example. The top surface 53A of the first insulating layer 53 is a smooth surface (low-roughness surface) with small recesses and projections. As an example, the surface roughness of the top surface 53A of the first insulating layer 53 is lower than that of the inner surface of each first via hole VH6. In an embodiment, the surface roughness of the top surface 53A of the first insulating layer 53 is lower than that of the side surface of each first via 64 that contacts the inner surface of the corresponding first via hole VH6. The top surface 53A of the first insulating layer 53 has surface roughness Ra of from about 10 nm to about 200 nm, for example.

First vias 64 are formed in the first via holes VH6. The first vias 64 penetrate through the first insulating layer 53 in the thickness direction of the first insulating layer 53 and electrically connect the first wiring layer 62 and a second wiring layer 71 formed on the top surface 53A of the first insulating layer 53. The first vias 64 fill in the first via holes VH6. Like the first via holes VH6, the first vias 64 are each formed into a tapered shape with a diameter increasing from a bottom side (on the part of the first wiring layer 62) to a top side (on the part of the second wiring layer 71) as depicted in FIG. 1B. As an example, the first vias 64 are each formed into a truncated cone shape with an end surface 64A larger in diameter than the bottom surfaces of the first vias 64. The end surfaces 64A of the first vias 64 may have a diameter of from about 50 μm to about 60 μm, for example. The bottom surfaces of the first vias 64 may have a diameter of from about 40 μm to about 50 μm, for example.

The end surfaces 64A of the first vias 64 each have a recessed part 64X dented toward the first wiring layer 62 in a lower layer (dented downward) to be in a position below the top surface 53A of the first insulating layer 53. The recessed part 64X is substantially semiellipsoidal in cross sectional view, for example. Specifically, the recessed part 64X includes a curved bottom surface dented downward to be in a position below the top surface 53A.

A fine wiring structure 70 is arranged on the top surface 53A of the first insulating layer 53. The fine wiring structure 70 includes piled fine wiring layers finer than the wiring layers 61 and 62. The fine wiring structure 70 includes the second wiring layer 71 arranged on the first insulating layer 53, a second insulating layer 81 covering the second wiring layer 71, a wiring layer 72 arranged on the top surface of the second insulating layer 81, an insulating layer 82 covering the wiring layer 72, a wiring layer 73 arranged on the top surface of the insulating layer 82, an insulating layer 83 covering the wiring layer 73, and an outermost wiring layer 74 arranged on the top surface of the insulating layer 83 that are arranged in the order named.

The wiring layers 71 to 74 are finer for example than the wiring layers 61 and 62 below the fine wiring structure 70. As an example, while the line-to-space (L/S) ratio of each of the wiring layers 61 and 62 is about 10 μm/10 μm, the L/S ratio of each of the wiring layers 71 to 74 is less than about 5 μm/5 μm, for example. The second wiring layer 71 is a fine wiring of a L/S ratio of about 3 to 4 μm/about 3 to 4 μm, for example. The wiring layers 72, 73 and 74 are each a fine wiring of a L/S ratio of about 2 μm/about 2 μm, for example. The wiring layers 71 to 74 are each thinner for example than the wiring layers 61 and 62 below the fine wiring structure 70. As an example, the wiring layers 71 to 73 each have a thickness of from about 1 μm to about 5 μm, preferably, from about 2.5 μm to about 3.0 μm. The outermost wiring layer 74 has a thickness of from about 5 to about 10 μm, for example. It is preferable that the wiring layers 71 to 74 be the same in thickness as the insulating layers 81 to 83 formed on the wiring layers 71 to 73 respectively, or thinner than the insulating layers 81 to 83 formed on the wiring layers 71 to 73 respectively. The wiring layers 61 and 62 each may have a relatively low wiring density and the wiring layers 71 to 74 each may have a relatively high wiring density. In some embodiments, the second wiring layer 71 has a wiring density higher than that of the first wiring layer 62.

The second wiring layer 71 is arranged on the end surfaces 64A of the first vias 64 and the upper surface 53A of the first insulating layer 53. The second wiring layer 71 is connected to the end surfaces 64A of the first vias 64. The second wiring layer 71 is formed to fill in the recessed parts 64X of the first vias 64 and to cover parts of the top surface 53A of the first insulating layer 53 formed around the first vias 64. A top surface 71A of the second wiring layer 71 is flat. The top surface 71A of the second wiring layer 71 has greater flatness than that of the end surfaces 64A of the first vias 64. As an example, the top surface 71A of the second wiring layer 71 is parallel to the top surface 53A of the first insulating layer 53.

The second insulating layer 81 is given second via holes VH7 that form openings in required positions of a top surface 81A of the second insulating layer 81. The second via holes VH7 pass through the second insulating layer 81 in the thickness direction of the second insulating layer 81 to expose parts of the top surface 71A of the second wiring layer 71. The second via holes VH7 are each formed into a tapered shape with a diameter increasing from a bottom side (on the part of the second wiring layer 71) to a top side (on the part of the wiring layer 72) as depicted in FIG. 1B. As an example, the second via holes VH7 are each formed into an inverted truncated cone shape with an opening diameter Ø3 of a top opening end A3 larger than an opening diameter Ø4 of a bottom opening end A4. In this case, the second via holes VH7 are each formed into a substantially inverted trapezoidal shape in cross sectional view and a substantially circular shape in plan view. It is preferable that the second insulating layer 81 be made of an insulating resin material different from a material for example for the insulating layers 51 to 53 formed below the fine wiring structure 70. It is preferable that the second insulating layer 81 be made of an insulating resin material having sensitivity to light, for example. Such a material for the second insulating layer 81 may be an insulating resin such as a phenol resin or a polyimide resin, for example.

The opening diameter Ø3 of each of the second via holes VH7 is set to be smaller than the opening diameter Ø1 of each of the first via holes VH6. The opening diameter Ø3 of each of the second via holes VH7 of this example is set to be smaller than the opening diameter Ø2 of each of the first via holes VH6. As an example, it is preferable that the opening diameter Ø3 of each of the second via holes VH7 be from about 0.1 to about 0.5 times the opening diameter Ø2 of each of the first via holes VH6. The opening diameter Ø3 of each of the second via holes VH7 may be from about 10 to about 20 µm, for example. The opening diameter Ø4 of each of the second via holes VH7 may be from about 5 to about 15 µm, for example.

The second via holes VH7 are formed to be shallower than the first via holes VH6. It is preferable that the depth of each of the second via holes VH7 be about 0.1 to about 0.5 times the depth of each of the first via holes VH6. The depth of each of the second via holes VH7 may be from about 3 to about 5 µm, for example. A thickness from the top surface 71A of the second wiring layer 71 to the top surface 81A of the second insulating layer 81 may be from about 3 to about 5 µm, for example. It is preferable that the thickness from the top surface 71A of the second wiring layer 71 to the top surface 81A of the second insulating layer 81 be about 0.5 times the opening diameter Ø3 of each of the second via holes VH7, for example.

Second vias 75 electrically connecting the second wiring layer 71 and the wiring layer 72 are formed in the second via holes VH7. The second vias 75 are formed to penetrate through the second insulating layer 81 in the thickness direction of the second insulating layer 81. The second vias 75 are formed to fill in the second via holes VH7. Like the second via holes VH7, the second vias 75 are each formed into a tapered shape with a diameter increasing from a bottom side (on the part of the second wiring layer 71) to a top side (on the part of the wiring layer 72) as depicted in FIG. 1B. As an example, the second vias 75 are each formed into an inverted truncated cone shape with a top surface larger in diameter than a bottom surface. The top surface of each of the second vias 75 may have a diameter of from about 10 to about 20 µm, for example. The bottom surface of each of the second vias 75 may have a diameter of from about 5 to about 15 µm, for example.

The second via holes VH7 and the second vias 75 are formed directly above the first via holes VH6 and the first vias 64 in a lower layer. More specifically, the second vias 75 (second via holes VH7) and the first vias 64 (first via holes VH6) are piled in a linear pattern in a direction where the layers of the wiring board 10 are piled (also called a vertical direction) and are connected to each other. Specifically, the second vias 75 (second via holes VH7) of this example are vias (via holes) of a stacked via structure piled (stacked) directly above the first vias 64 (first via holes VH6) through the second wiring layer 71. In this way, the second wiring layer 71 with the flat top surface 71A and the second vias 75 each having a diameter of half or less of the diameter of each of the first vias 64 are stacked directly above the first vias 64.

Figure 2A:
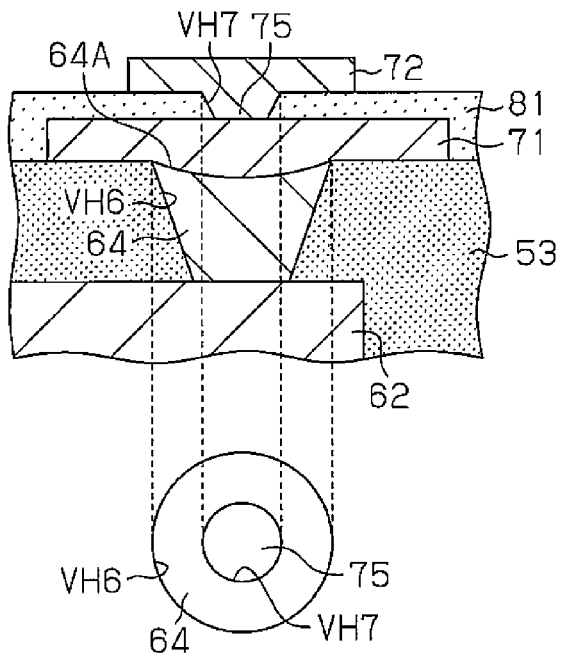
FIGS. 2A and 2B are schematic views each explaining the planar arrangement of vias forming a stacked via structure.
Figure 2B:
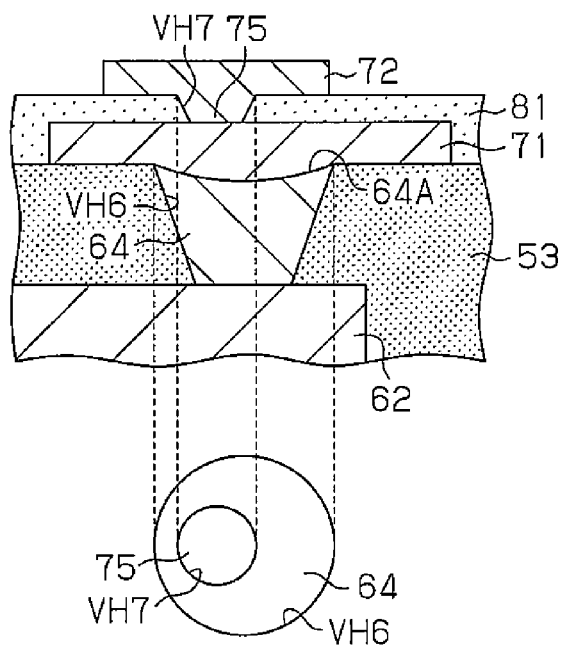

In the example of FIG. 2A, the center of the top surface of the second via 75 substantially coincides with the center of the end surface 64A of the first via 64 in plan view. The second via 75 is smaller in diameter than the first via 64. Accordingly, the entire top surface of the second via 75 overlaps the top surface of the first via 64 in plan view. As depicted in FIG. 2B, the center of the top surface of the second via 75 may not coincide with the center of the first via 64 in plan view. In this case, it is preferable that the entire top surface of the second via 75 overlap the top surface of the first via 64 in plan view.

It is preferable that the second vias 75 be piled above the first vias 64 such that boundaries between the second vias 75 and the second insulating layer 81 are arranged in positions shifted from boundaries between the first vias 64 and the first insulating layer 53 in plan view.

As depicted in FIG. 1B, the wiring layer 72 is arranged on the top surface 81A of the second insulating layer 81 so as to be connected to the top surfaces of the second vias 75. The wiring layers 71 and 72 and the second vias 75 may each be made of a material such as copper or a copper alloy, for example.

The insulating layer 82 is given via holes VH8 formed in required positions and passing through the insulating layer 82 in the thickness direction of the insulating layer 82. Vias 76 electrically connecting the wiring layers 72 and 73 are formed in the via holes VH8. The vias 76 are formed to fill in the via holes VH8. The insulating layer 83 is given via holes VH9 formed in required positions and passing through the insulating layer 83 in the thickness direction of the insulating layer 83. Vias 77 electrically connecting the wiring layer 73 and the outermost wiring layer 74 are formed in the via holes VH9. The vias 77 are formed to fill in the via holes VH9. The via holes VH8, the via holes VH9, the vias 76, and the vias 77 are each formed into a tapered shape with a diameter increasing from a bottom side (on the part of the wiring layer 72) to a top side (on the part of the outermost wiring layer 74) as depicted in FIG. 1B. As an example, the via holes VH8 and the via holes VH9 are each formed into an inverted truncated cone shape with an opening diameter of a top opening end larger than an opening diameter of a bottom opening end. The vias 76 and the vias 77 are each formed into an inverted truncated cone shape with an a top surface larger in diameter than a bottom surface.

The via holes VH8, the via holes VH9, the vias 76, and the vias 77 are formed directly above the second via holes VH7 and the second vias 75 in a lower layer. More specifically, the second vias 75, the vias 76, and the vias 77 are piled in a linear pattern in the direction where the layers of the wiring board 10 are piled and are connected to each other. Specifically, the vias 76 of this example are vias of a stacked via structure stacked directly above the second vias 75 through the wiring layer 72. The vias 77 of this example are vias of a stacked via structure stacked directly above the vias 76 through the wiring layer 73.

The insulating layers 81 to 83 are formed to be thinner for example than the insulating layers 51 to 53 below the fine wiring structure 70. As an example, a thickness from the top surface 71A of the second wiring layer 71 to the top surface 81A of the second insulating layer 81, a thickness from the top surface of the wiring layer 72 to the top surface of the insulating layer 82, and a thickness from the top surface of the wiring layer 73 to the top surface of the insulating layer 83, may each be from about 1 to about 20 µm (preferably, from about 3 to about 5 µm). The wiring layers 73 and 74, the vias 76, and the vias 77 may each be made of a material such as copper or a copper alloy, for example. Like the second insulating layer 81, it is preferable that the insulating layers 82 and 83 each be made of an insulating resin material different from a material for example for the insulating layers 51 to 53 formed below the fine wiring structure 70. It is preferable that the insulating layers 82 and 83 each be made of an insulating resin material having sensitivity to light, for example. Such a material for each of the insulating layers 82 and 83 may be an insulating resin such as a phenol resin or a polyimide resin, for example.

It is preferable that the insulating layers 81, 82 and 83 each be made of a resin that does not contain a solid filler such as a fiber filler and a particle filler so that the insulating layers 81, 82 and 83 each have a flat surface (a smooth surface) for facilitating the formation of a fine wiring layer. A solid filler may become exposed on the surface of the insulating layer and lower the surface flatness of the insulating layer. It is preferable that the insulating layers 81, 82 and 83 each be made of a photosensitive resin that does not contain a solid filler when the fine via holes, such as VH7 and/or VH8, are formed through an exposure process and a developing process. A solid filler may prevent the photosensitive resin from being exposed.

The structure of a semiconductor device 90 is described next.

Figure 3:
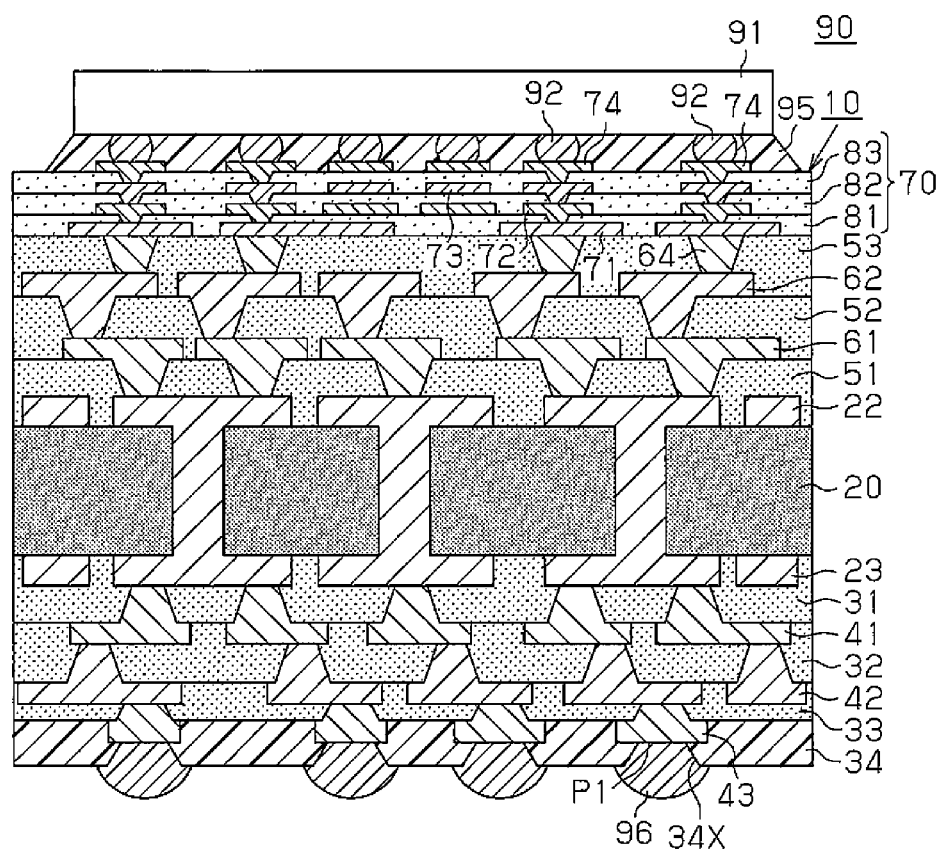
FIG. 3 is a cross sectional view illustrating an outline of a semiconductor device according to the embodiment.

As depicted in FIG. 3, the semiconductor device 90 includes the wiring board 10, a semiconductor chip 91, an underfill resin 95, and the external connection terminals 96.

The semiconductor chip 91 is flip-chip mounted on the wiring board 10. Specifically, bumps 92 formed on a circuit forming surface (bottom surface as depicted in FIG. 3) of the semiconductor chip 91 are bonded to the outermost wiring layer 74 (pad) of the fine wiring structure 70, thereby electrically connecting the semiconductor chip 91 to the outermost wiring layer 74 through the bumps 92.

The semiconductor chip 91 may be a logic chip such as a central processing unit (CPU) chip or a graphics processing unit (GPU) chip, for example. The semiconductor chip 91 may be a memory chip such as a dynamic random access memory (DRAM) chip, a static random access memory (SRAM) chip, or a flash memory chip, for example. The semiconductor chip 91 may have a size of from about 3 mm×3 mm to about 12 mm×12 mm in plan view, for example. The semiconductor chip 91 may have a thickness of from about 50 to about 100 µm, for example.

As an example, gold bumps or solder bumps may be used as the bumps 92. Examples of a material applicable for the solder bumps include an alloy containing lead (Pb), an alloy of tin (Sn) and Au, an alloy of Sn and Cu, an alloy of Sn and silver (Ag), and an alloy of Sn, Ag and Cu.

The underfill resin 95 is provided so as to fill in a gap between the wiring board 10 and the semiconductor chip 91. The underfill resin 95 may be made of an insulating resin material such as an epoxy resin.

The external connection terminals 96 are formed on the external connection pads P1 of the wiring board 10. The external connection terminals 96 are to be electrically connected to a pad provided to a mounting substrate such as a mother board not illustrated in the drawings, for example. As an example, solder balls or lead pins may be used as the external connection terminals 96. The external connection terminals 96 may be solder balls, for example.

The operation of the wiring board 10 and that of the semiconductor 90 are described next.

The top surface 53A of the first insulating layer 53 has greater smoothness than that of the inner surfaces of the first via holes VH6 in the first insulating layer 53. Thus, a metallic film (such as a seed layer) may be formed uniformly on the top surface 53A of the first insulating layer 53 for example by sputtering. Additionally, the top surface 53A of the first insulating layer 53 is a smooth surface with small recesses and projections. This may suppress the occurrence of residues during removal of the seed layer by etching, compared to the case where the top surface 53A of the first insulating layer 53 is a roughed surface with large recesses and projections.

The second wiring layer 71 is formed on the first vias 64. The second wiring layer 71 fills in the recessed parts 64X of the first vias 64 to be connected to the first vias 64. The second wiring layer 71 has the top surface 71A having greater flatness than that of the end surfaces 64A of the first vias 64. Accordingly, even if the recessed parts 64X are formed in the end surfaces 64A of the first vias 64 during for example smoothening of the top surface 53A of the first insulating layer 53, the resultant second wiring layer 71 (pad) still has the flat top surface 71A. As a result, the bottoms of the second vias 75 may be connected to the flat top surface 71A suitably, compared to the case where the second vias 75 are stacked directly on the end surfaces 64A with the recessed parts 64X. Specifically, the second vias 75 and the second wiring layer 71 (first vias 64) may be connected with a high degree of reliability, compared to the case where the second vias 75 are directly connected to the end surfaces 64A of the first vias 64. This allows the second vias 75 to be stacked suitably directly above the first vias 64 through the second wiring layer 71, thereby encouraging increase of a wiring density.

A method of manufacturing the wiring board 10 is described next.

Figure 4A:
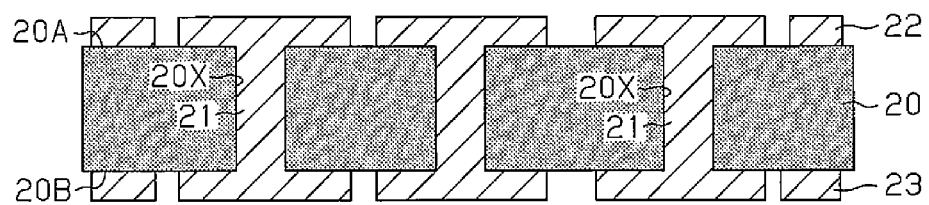
FIGS. 4A to 4C, 5A and 5B, 6A and 6B, and 7A are cross sectional views each illustrating an outline of a method of manufacturing the wiring board according to the embodiment.

First, in a step depicted in FIG. 4A, the through holes 20X are formed for example in a copper clad laminate (CCL) to become the core substrate 20. Then, the penetrating electrodes 21 are formed by process such as electrolytic plating or paste filling in the through holes 20X. Next, the wiring layer 22 is formed on the top surface 20A of the core substrate 20 and the wiring layer 23 is formed on the bottom surface 20B of the core substrate 20 by subtractive process.

Figure 4B:
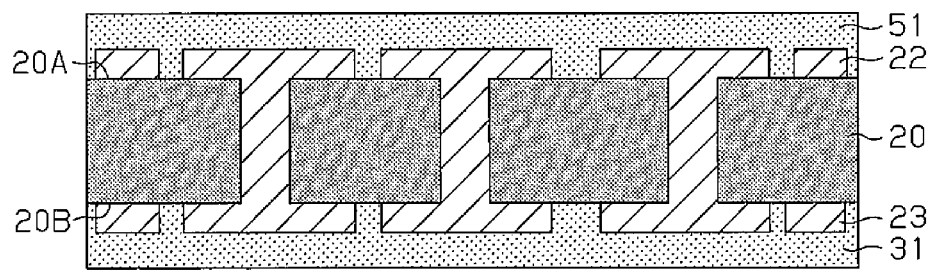

Next, in a step depicted in FIG. 4B, the insulating layer 31 is formed to cover the bottom surface 20B of the core substrate 20 and the wiring layer 23. The insulating layer 51 is further formed to cover the top surface 20A of the core substrate 20 and the wiring layer 22. The insulating layers 31 and 51 may be formed for example by laminating a resin film on the core substrate 20 and then thermally processing the resin film at a temperature of from about 130° C. to about 200° C.

while pressing the resin film to cure the resin film. A film of a thermosetting resin such as an epoxy resin may be used as this resin film.

Figure 4C:
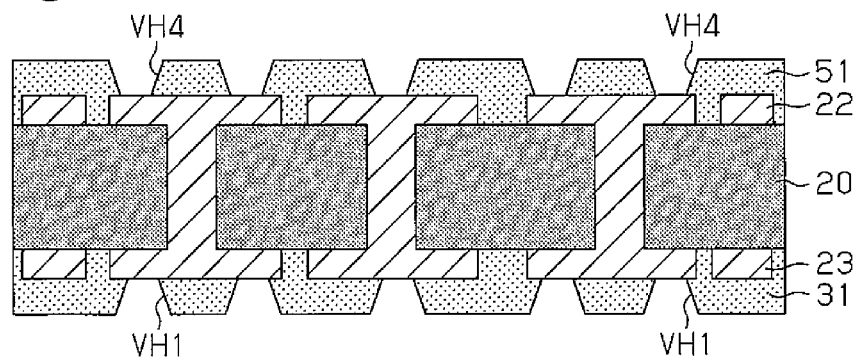

Next, in a step depicted in FIG. 4C, the via holes VH1 are formed in given positions of the insulating layer 31 so as to expose parts of the bottom surface of the wiring layer 23. Further, the via holes VH4 are formed in given positions of the insulating layer 51 so as to expose parts of the top surface of the wiring layer 22. The via holes VH1 and the via holes VH4 may be formed by laser processing using a $CO_2$ laser or a UV-YAG laser, for example. If the insulating layers 31 and 51 are formed using a photosensitive resin, the required via holes VH1 and the via holes VH4 may be formed by photolithography, for example.

If the via holes VH1 and the via holes VH4 are formed by laser processing, a desmearing process is performed thereafter to remove resin smears attached to surfaces of the wiring layers 22 and 23 exposed at the bottoms of the via holes VH1 and the via holes VH4.

Figure 5A:
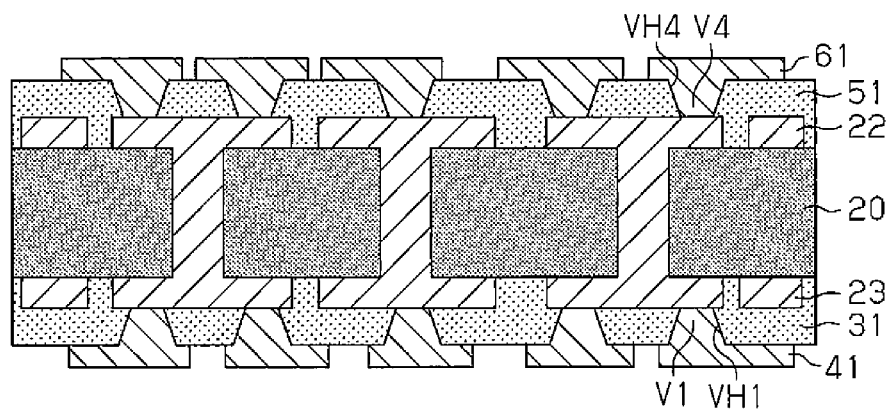

Next, in a step depicted in FIG. 5A, the vias V1 are formed in the via holes VH1 in the insulating layer 31 and the wiring layer 41 to be electrically connected to the wiring layer 23 through the vias V1 is formed on the bottom surface of the insulating layer 31. Further, the vias V4 are formed in the via holes VH4 in the insulating layer 51 and the wiring layer 61 to be electrically connected to the wiring layer 22 through the vias V4 is formed on the top surface of the insulating layer 51. The vias V1, the vias V4, and the wiring layers 41 and 61 may be formed by any process of wiring formation such as semi-additive process or subtractive process, for example. As a result of such process of wiring formation, the vias V1, the vias V4, and the wiring layers 41 and 61 are formed that are made of plated metal composed of copper or a copper alloy, for example.

Figure 5B:
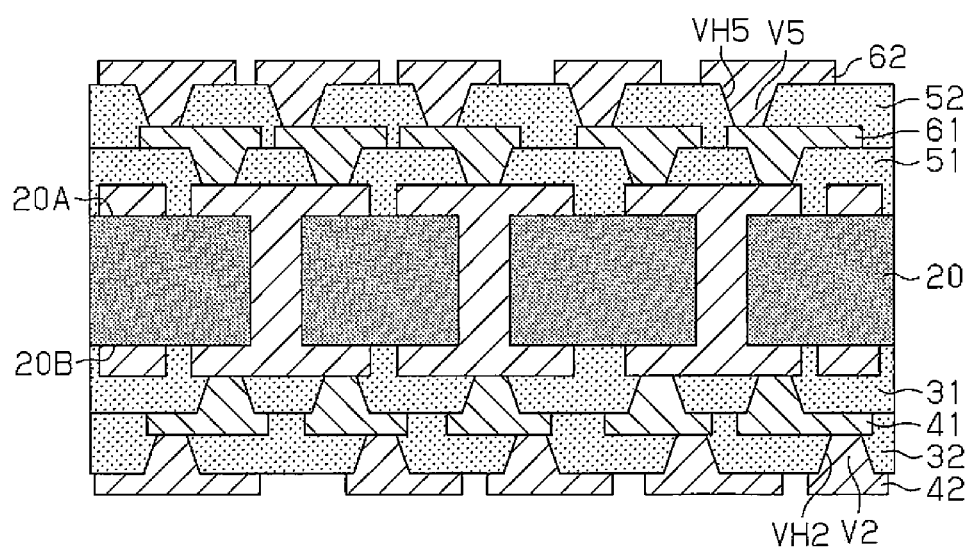

Steps similar to the steps depicted in FIGS. 4B to 5A are repeated thereafter to pile the insulating layer 32 and the wiring layer 42 on the part of the bottom surface 20B of the core substrate 20 and to pile the insulating layer 52 and the first wiring layer 62 on the part of the top surface 20A of the core substrate 20, as depicted in FIG. 5B.

Steps similar to the steps depicted in FIGS. 4B and 4C are repeated thereafter to form the insulating layer 33 with the via holes VH3 on the bottom surface of the insulating layer 32 and to form the first insulating layer 53 with the first via holes VH6 on the top surface of the insulating layer 52.

If the via holes VH3 and the via holes VH6 are formed by laser processing, a desmearing process is performed thereafter to remove resin smears attached to surfaces of the wiring layers 42 and 62 exposed at the bottoms of the via holes VH3 and the via holes VH6. This desmearing process roughens the inner surfaces of the first via holes VH6 and the top surface 53A of the first insulating layer 53. This desmearing process further roughens the inner surfaces of the via holes VH3 and the bottom surface of the insulating layer 33.

Figure 6A:
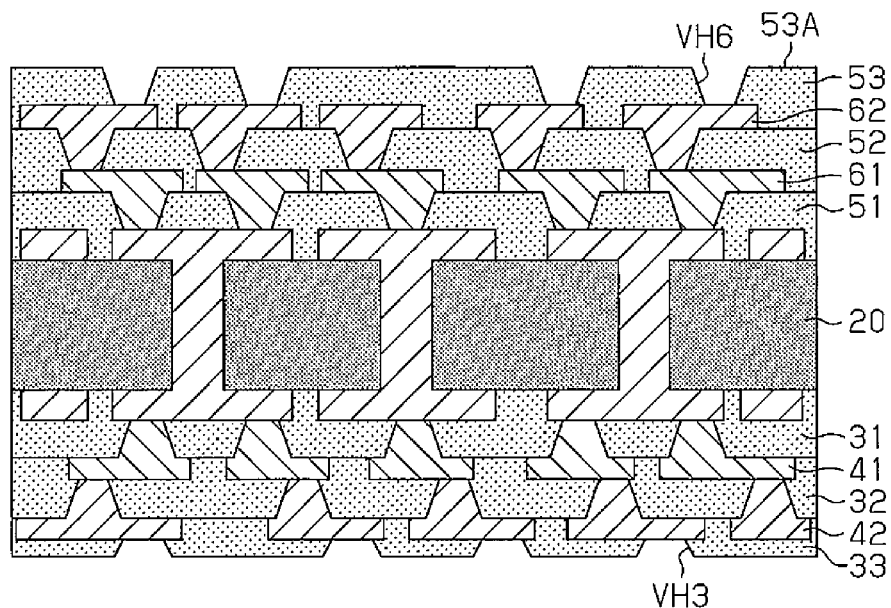
Figure 6B:
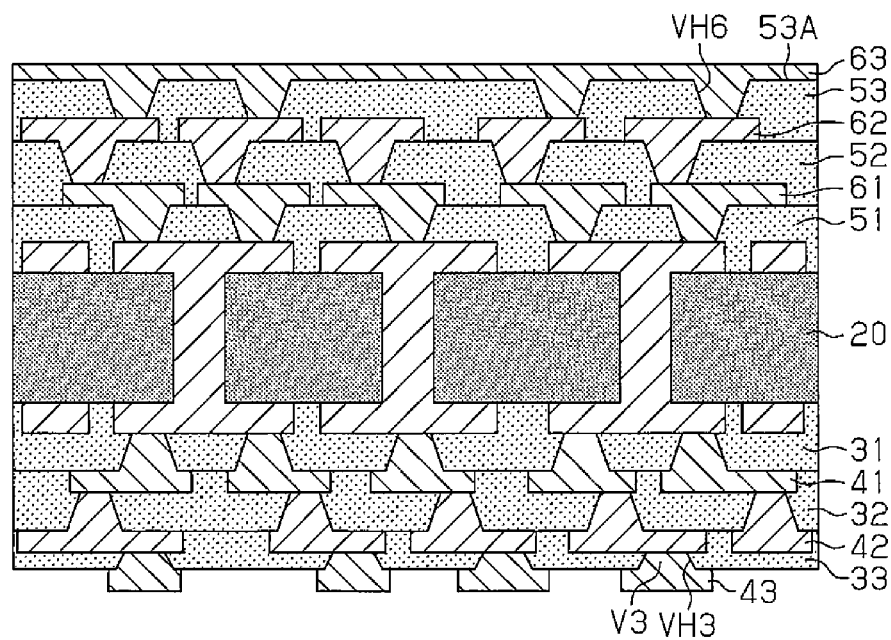

Next, in a step depicted in FIG. 6B, the vias V3 are formed in the via holes VH3 in the insulating layer 33 and the wiring layer 43 to be electrically connected to the wiring layer 42 through the vias V3 is formed on the bottom surface of the insulating layer 33. The vias V3 and the wiring layer 43 may be formed by any process of wiring formation such as semi-additive process or subtractive process, for example.

In the step depicted in FIG. 6B, a seed layer (not depicted in the drawings) is formed to cover the entire surface of the first insulating layer 53 including the inner surfaces of the first via holes VH6. Then, electrolytic plating (panel plating) is performed using the seed layer as a power feeding layer. As an example, the seed layer is formed to cover the entire surface of the first insulating layer 53 by electroless copper plating and electrolytic copper plating is performed using the resultant seed layer as a power feeding layer. This forms a conductive layer 63 filling in the first via holes VH6 and entirely covering the top surface 53A of the first insulating layer 53.

Figure 7A:
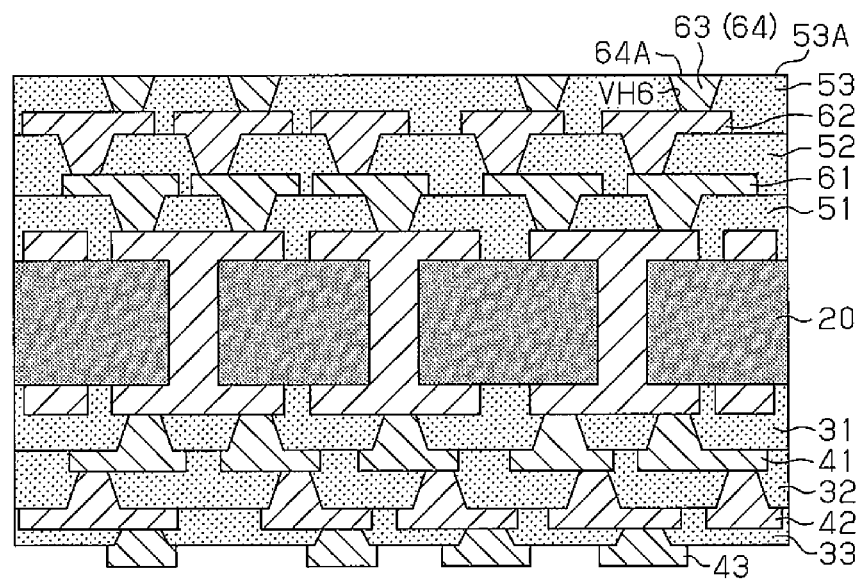
Figure 7B:
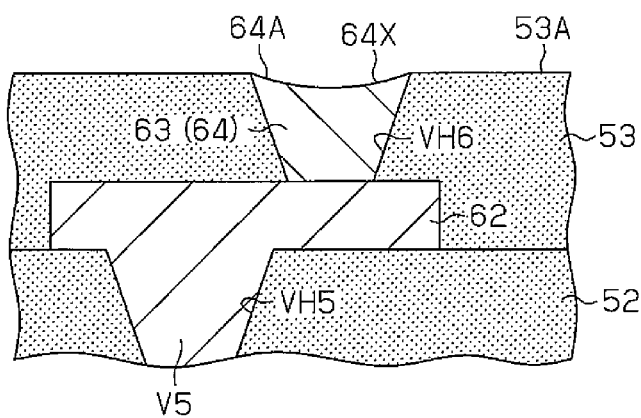
FIG. 7B is a cross sectional view illustrating part of FIG. 7A in an enlarged manner.

Next, in a step depicted in FIG. 7A, using process such as CMP, for example, the conductive layer 63 is polished in areas projecting from the top surface 53A of the first insulating layer 53 and the top surface 53A of the first insulating layer 53 as a roughened surface is polished. This forms the first vias 64 filling in the first via hole VH6 and smoothens the top surface 53A of the first insulating layer 53. At this time, the inner surfaces of the first via holes VH6 remain roughened. This makes the surface roughness of the top surface 53A of the insulating layer 53 lower than that of the inner surfaces of the first via holes VH6. In this step, the top surface 53A of the first insulating layer 53 and the conductive layer 63 are polished until the top surface 53A of the first insulating layer 53 is smoothened (until the value of the surface roughness Ra becomes 0.2 μm or less). During the CMP process performed in this step, a difference is generated between the amount of polishing of the conductive layer 63 and that of the first insulating layer 53. In this example, the amount of polishing of the conductive layer 63 is made larger than that of the first insulating layer 53 by adjusting a material for slurry or the hardness of a polishing pad, for example. This makes the amount of polishing of the conductive layer 63 larger than that of the first insulating layer 53 while the top surface 53A of the first insulating layer 53 is to be smoothened by polishing, thereby forming the recessed part 64X in the end surface 64A of the first via 64 (conductive layer 63), as depicted in FIG. 7B.

Steps described below depicted in FIGS. 8A to 13A are intended to form the fine wiring structure 70 on the first insulating layer 53. Accordingly, a structure on the part of the bottom surface 20B of the core substrate 20 is omitted from FIGS. 8A to 13A.

Figure 8A:
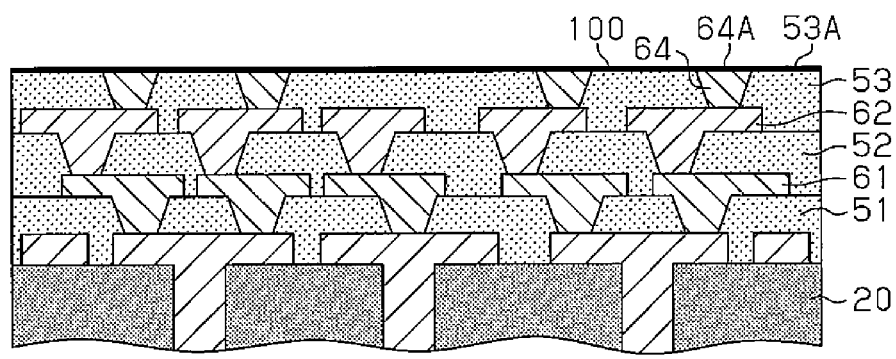
FIGS. 8A and 8B, 9A and 9B, and 10A are cross sectional views each illustrating the outline of the method of manufacturing the wiring board according to the embodiment.

In a step depicted in FIG. 8A, a seed layer 100 is thereafter formed so as to cover the top surface 53A of the first insulating layer 53 and the end surfaces 64A of the first vias 64. The seed layer 100 may be formed for example by sputtering or electroless plating. The top surface 53A of the first insulating layer 53 is a smooth surface in this step. Thus, the seed layer 100 may be formed uniformly for example by performing sputtering on the top surface 53A, and the top surface of the seed layer 100 may become a smooth surface. This may make the seed layer 100 thinner than the seed layer 100 formed by performing sputtering on a roughened surface. In an exemplary way of forming the seed layer 100 by sputtering, titanium (Ti) is deposited first by sputtering on the top surface 53A of the first insulating layer 53 and the end surfaces 64A of the first vias 64 so as to cover the top surface 53A and the end surfaces 64A, thereby forming a Ti layer. Then, copper is deposited by sputtering on the Ti layer to form a Cu layer. As a result, the seed layer 100 of a two-layer structure (with Ti and Cu layers) may be formed. This Ti layer may have a thickness of for example from about 20 to about 50 nm and this Cu layer may have a thickness of for example from about 100 to about 300 nm. The seed layer 100 of a two-layer structure including a TiN layer made of titanium nitride (TiN) and the Cu layer may be formed by changing the aforementioned Ti layer to the TiN layer. If electroless plating is used to form the seed layer 100, the resultant seed layer 100 may be composed of a Cu layer formed by electroless copper plating, for example.

Figure 8B:
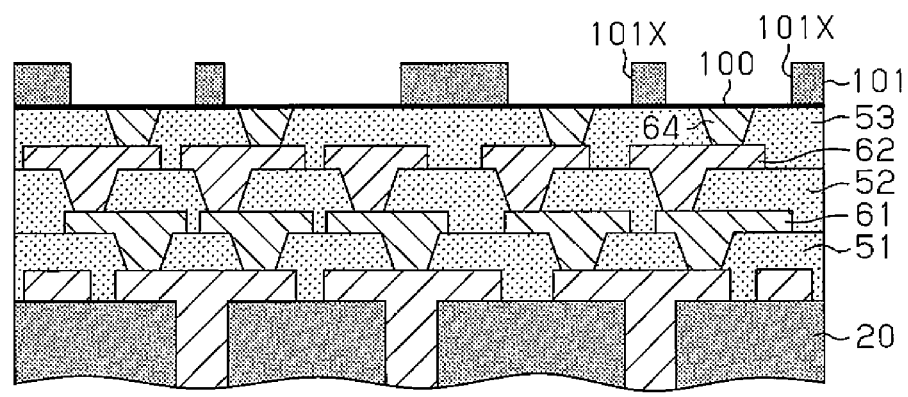

Next, in a step depicted in FIG. 8B, a resist layer 101 is formed on the seed layer 100. The resist layer 101 has an opening pattern 101X formed in a given area. The opening pattern 101X is formed so as to expose part of the seed layer 100 corresponding to a region where the second wiring layer 71 (see FIG. 1B) is to be formed. The resist layer 101 may be made of a material having resistance to plating process performed in a next step, for example. The material for the resist layer 101 may be a photosensitive dry film resist or a liquid photoresist (such as a dry film resist or a liquid resist of a novolac based resin or an acrylic based resin), for example. If the photosensitive dry film resist is used, a dry film is laminated by thermocompression bonding on the top surface of the seed layer 100. The dry film is patterned by photolithography to form the resist layer 101 having the opening pattern 101X. The liquid photoresist may be used in a similar step to form the resist layer 101. In this step, the resist layer 101 is formed on the smooth top surface of the seed layer 100. This may suppress the occurrence of a patterning failure in the resist layer 101. Specifically, the opening pattern 101X may be formed with a high degree of accuracy in the resist layer 101.

Figure 9A:
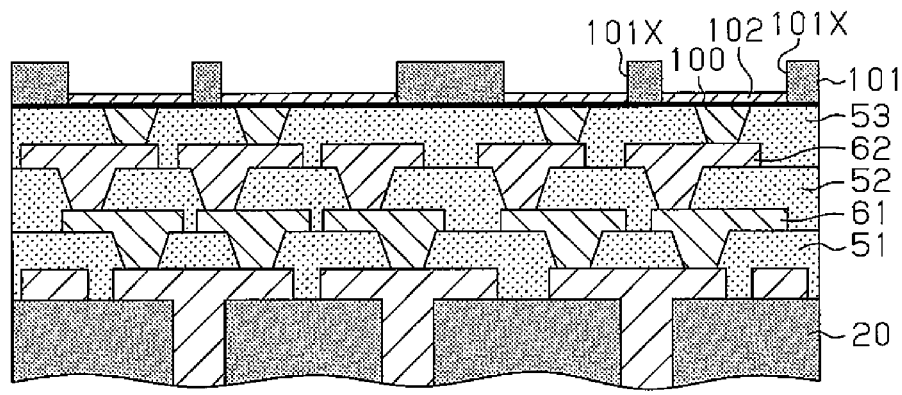
Figure 9B:
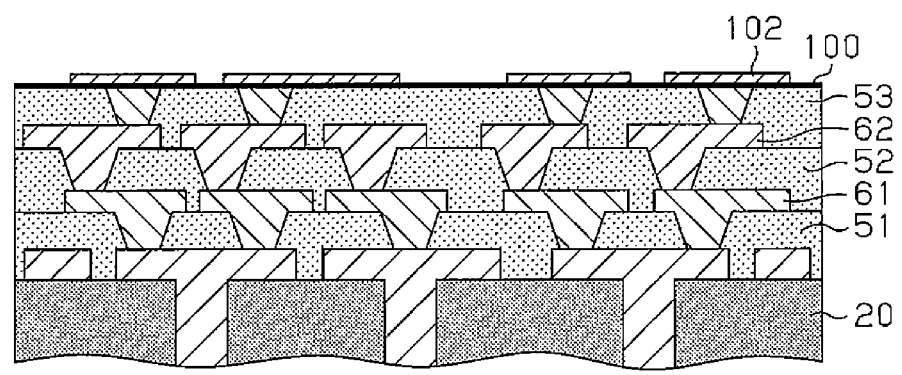

Next, in a step depicted in FIG. 9A, the top surface of the seed layer 100 is subjected to electrolytic plating using the resist layer 101 as a plating mask and using the seed layer 100 as a plating power feeding layer. More specifically, electrolytic plating (here, electrolytic copper plating) is performed on part of the seed layer 100 exposed through the opening pattern 101X of the resist layer 101, thereby forming an electrolytic copper plated layer 102 on this part of the top surface of the seed layer 100. Next, in a step depicted in FIG. 9B, the resist layer 101 in FIG. 9A is removed for example with an alkaline peeling liquid.

Figure 10A:
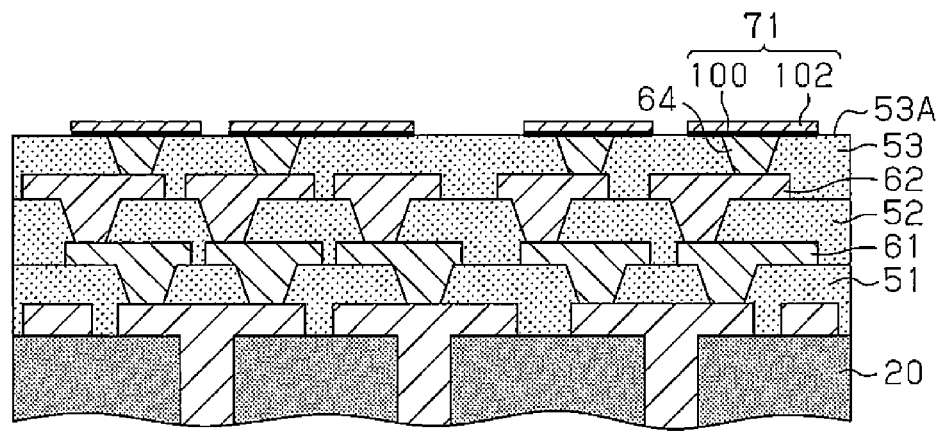
Figure 10B:
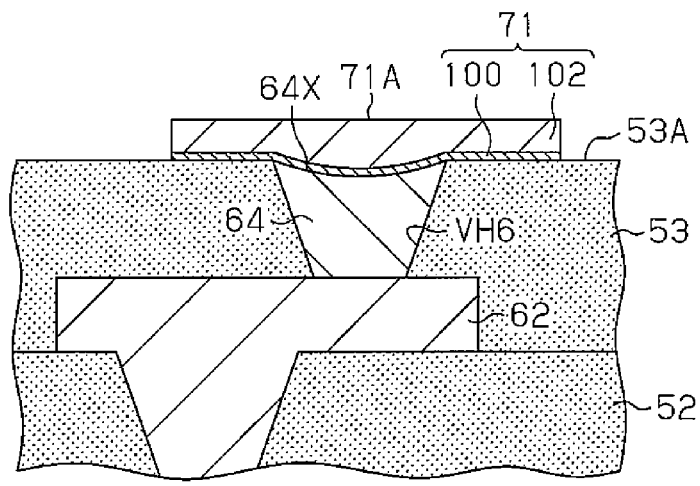
FIG. 10B is a cross sectional view illustrating part of FIG. 10A in an enlarged manner.

Next, in a step depicted in FIG. 10A, unnecessary part of the seed layer 100 is removed by etching using the electrolytic copper plated layer 102 as an etching mask. This forms the second wiring layer 71 including the seed layer 100 and the electrolytic copper plated layer 102 on the first insulating layer 53. As this time, as depicted in FIG. 10B, the second wiring layer 71 is formed to fill in the recessed part 64X of the first via 64 by the presence of the seed layer 100 and the electrolytic copper plated layer 102 while the top surface 71A of the second wiring layer 71 is formed as a flat surface. In this way, the second wiring layer 71 finer for example than the wiring layers 61 and 62 in lower layers is formed by semiadditive process.

Figure 11A:
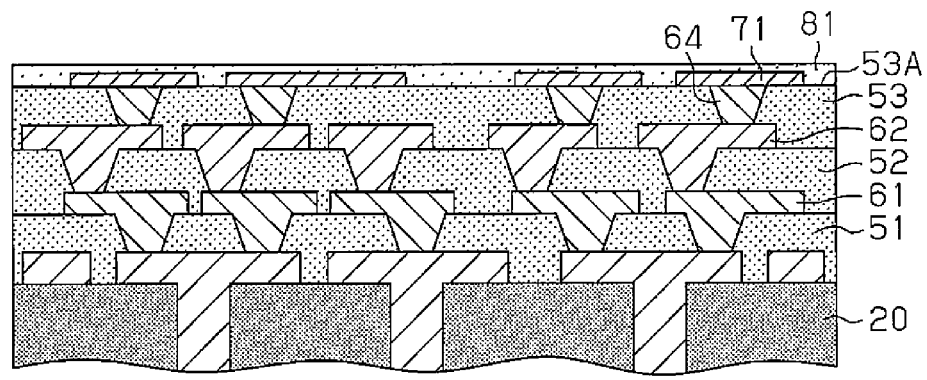
FIGS. 11A and 11B, and 12A and 12C are cross sectional views each illustrating the outline of the method of manufacturing the wiring board according to the embodiment.

Next, in a step depicted in FIG. 11A, the second insulating layer 81 is formed on the top surface 53A of the first insulating layer 53 to cover the entire surface of the second wiring layer 71. The second insulating layer 81 is formed for example by laminating a resin film by thermocompression bonding on the top surface 53A of the first insulating layer 53. This resin film may be a film of a photosensitive resin such as a phenol resin or a polyimide resin, for example.

Figure 11B:
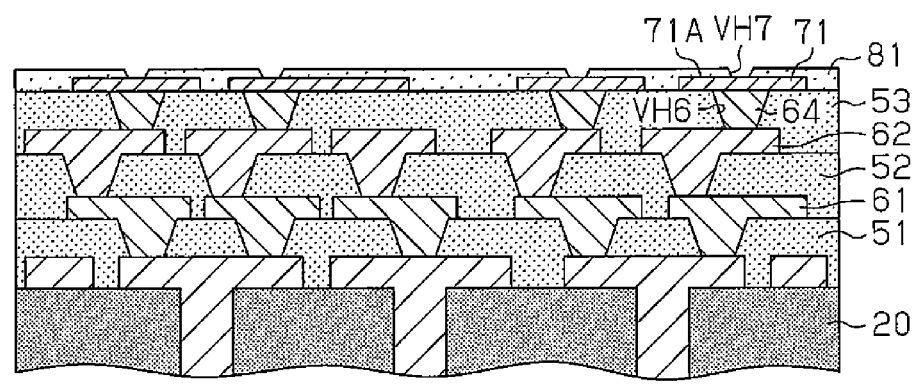

Next, in a step depicted in FIG. 11B, the second via holes VH7 are formed in required positions of the second insulating layer 81 for example by photolithography to expose parts of the top surface 71A of the second wiring layer 71. In this step, the second via holes VH7 smaller in diameter than the first via holes VH6 are formed in the second insulating layer 81 to expose parts of the top surface 71A of the second wiring layer 71 directly above the first via holes VH6 (first vias 64). As an example, the second via holes VH7 smaller in diameter than the first via holes VH6 are formed in the second insulating layer 81 such that the central axis of each of the second via holes VH7 coincides with the central axis of each of the first via holes VH6 (first vias 64). In this step, the top surface 71A of the second wiring layer 71 is flat. Thus, the second via holes VH7 may be formed with a high degree of accuracy in the second insulating layer 81 by the aforementioned photolithography.

Figure 12A:
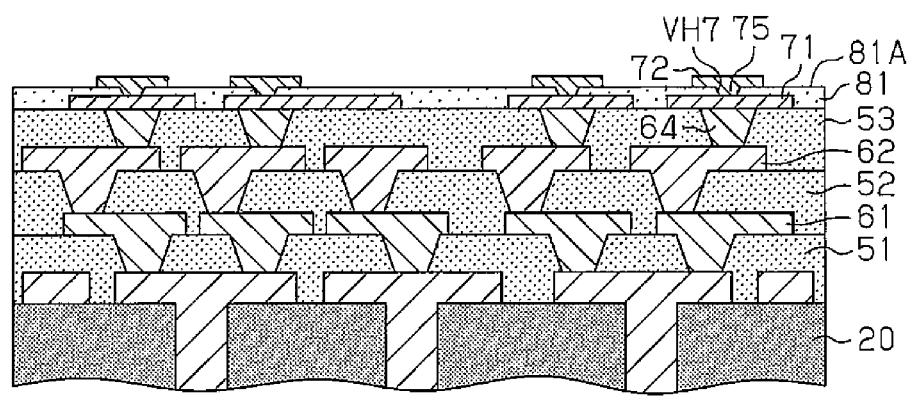
Figure 12B:
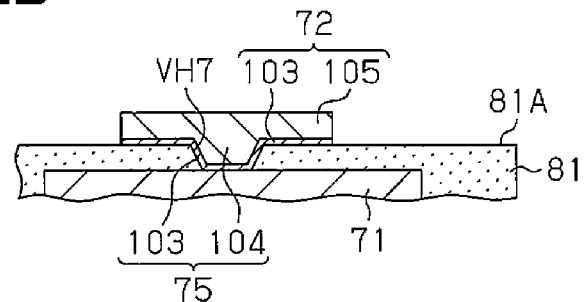
FIG. 12B is a cross sectional view illustrating part of FIG. 12A in an enlarged manner.

Next, in a step depicted in FIG. 12A, the second vias 75 are formed to fill in the second via holes VH7 and the wiring layer 72 is formed on the second insulating layer 81. The second vias 75 and the wiring layer 72 are formed by an exemplary way described below by referring to FIG. 12B.

First, a seed layer 103 is formed by sputtering or electroless plating to cover the entire top surface 81A of the second insulating layer 81 including the inner surfaces of the second via holes VH7. In an exemplary way of forming the seed layer 103 by sputtering, titanium (Ti) is deposited first by sputtering on the top surface 81A of the second insulating layer 81 so as to cover the entire top surface 81A of the second insulating layer 81 including the inner surface of the second via hole VH7, thereby forming a Ti layer. Then, copper is deposited by sputtering on the Ti layer to form a Cu layer. As a result, the seed layer 103 of a two-layer structure (with Ti and Cu layers) may be formed. This Ti layer may have a thickness of for example from about 20 to about 50 nm and this Cu layer may have a thickness of for example from about 100 to about 300 nm. The seed layer 103 of a two-layer structure including a TiN layer made of titanium nitride (TiN) and the Cu layer may be formed by changing the aforementioned Ti layer to the TiN layer. If electroless plating is used to form the seed layer 103, the resultant seed layer 103 may be composed of a Cu layer formed by electroless copper plating, for example.

A resist layer (not illustrated in the drawings) having an opening corresponding to the wiring layer 72 is thereafter formed on the seed layer 103. Then, electrolytic plating (electrolytic copper plating, for example) is performed using the seed layer 103 as a plating power feeding layer. This forms an electrolytic copper plated layer 104 to fill in the second via hole VH7 while forming an electrolytic copper plated layer 105 on the electrolytic copper plated layer 104 and on part of the seed layer 103 exposed through the aforementioned opening of the resist layer. This resist layer is removed thereafter. Then, unnecessary part of the seed layer 103 is removed by etching using the electrolytic copper plated layer 105 as a mask. This forms the second via 75 including the seed layer 103 and the electrolytic copper plated layer 104 formed in the second via hole VH7 and stacked directly above the first via 64 through the second wiring layer 71. This further forms the wiring layer 72 including the seed layer 103 and the electrolytic copper plated layer 105 existing over the top surface 81A of the second insulating layer 81. In this way, the second via 75 and the wiring layer 72 are formed for example by semiadditive process.

Figure 12C:
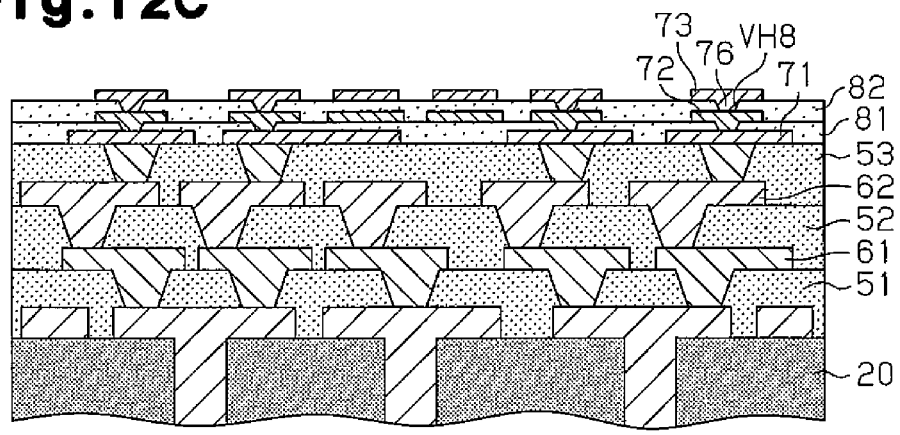

Next, in a step depicted in FIG. 12C, like in the steps of FIGS. 11A and 11B, the insulating layer 82 is formed on the second insulating layer 81. The insulating layer 82 has the via holes VH8 through which parts of the top surface of the wiring layer 72 are exposed. Next, like in the step of FIG. 12A, the vias 76 are formed to fill in the via holes VH8 and the wiring layer 73 is formed on the insulating layer 82 for example by semiadditive process.

Figure 13A:
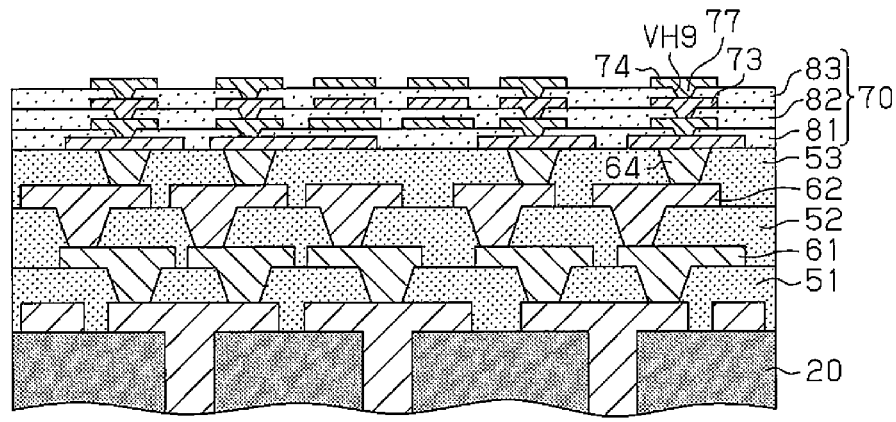
FIGS. 13A and 13B are cross sectional views each illustrating the outline of the method of manufacturing the wiring board according to the embodiment.

Next, in a step depicted in FIG. 13A, like in the steps of FIGS. 11A and 11B, the insulating layer 83 is formed on the insulating layer 82. The insulating layer 83 has the via holes VH9 through which parts of the top surface of the wiring layer 73 are exposed. Next, like in the step of FIG. 12A, the vias 77 are formed to fill in the via holes VH9 and the outermost wiring layer 74 is formed on the insulating layer 83 for example by semiadditive process.

Figure 13B:
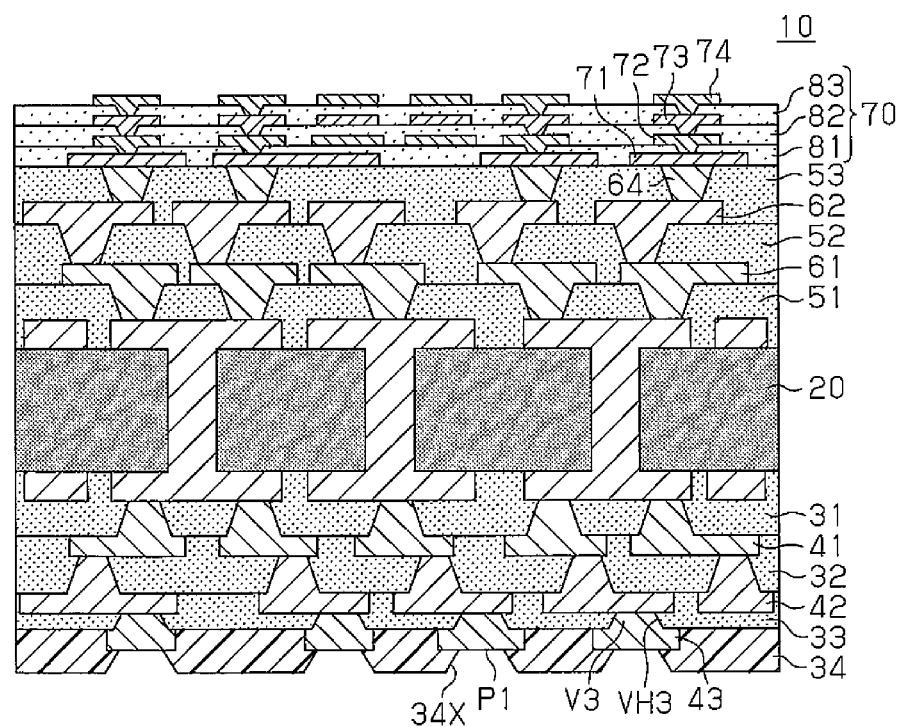

Next, in a step depicted in FIG. 13B, the solder resist layer 34 is formed on the bottom surface of the insulating layer 33.

The solder resist layer 34 has the openings 34X through which the external connection pads P1 defined in required positions of the bottommost wiring layer 43 are to be exposed. The solder resist layer 34 may be formed for example by laminating a photosensitive solder resist film or applying a liquid solder resist and patterning the resist into a required shape. As a result, parts of the wiring layer 43 are exposed as the external connection pads P1 through the openings 34X of the solder resist layer 34. Where necessary, an Ni layer and an Au layer may be piled in order over the wiring layer 43 (specifically, external connection pads P1) exposed through the openings 34X of the solder resist layer 34. These Ni and Au layers may be formed for example by electroless plating.

The wiring board 10 depicted in FIG. 1A may be manufactured by the aforementioned steps.

A method of manufacturing the semiconductor device 90 is described next.

Figure 14:
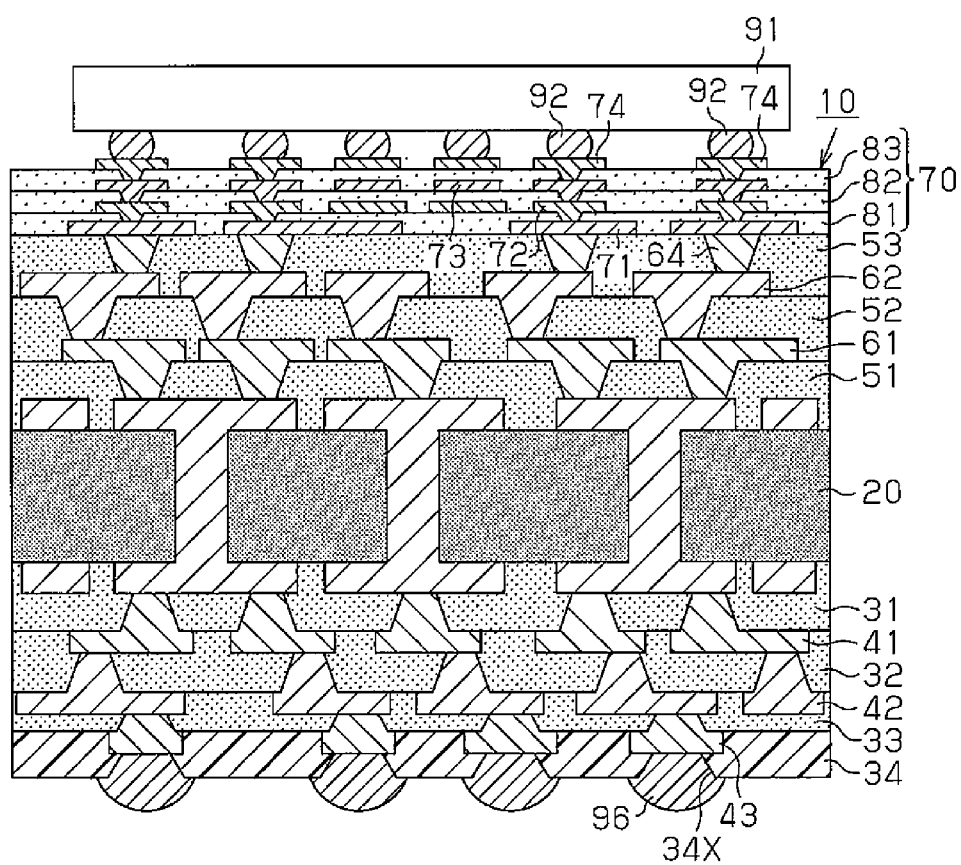
FIG. 14 is a cross sectional view illustrating an outline of a method of manufacturing the semiconductor device including the wiring board according to the embodiment.

In a step depicted in FIG. 14, the external connection terminals 96 are formed on the external connection pads P1. As an example, flux is applied where appropriate on the external connection pads P1. Then, the external connection terminals 96 (here, solder balls) are mounted on the external connection pads P1. The external connection terminals 96 are thereafter fixed by reflow at a temperature of from about 240° C. to about 260° C. Then, the flux are removed by surface cleaning.

In the step depicted in FIG. 14, the semiconductor chip 91 is mounted on the wiring board 10. More specifically, the bumps 92 of the semiconductor chip 91 are flip-chip bonded on the outermost wiring layer 74 (pad) of the wiring board 10. Next, the underfill resin 95 (see FIG. 3) is poured to fill in the gap between the semiconductor chip 91 and the wiring board 10 flip-chip bonded to each other. Then, the underfill resin 95 is cured. The semiconductor device 90 depicted in FIG. 3 may be manufactured by the aforementioned steps.

The aforementioned embodiment achieves the following effects.

(1) The top surface 53A of the first insulating layer 53 has greater smoothness than that of the inner surfaces of the first via holes VH6 in the first insulating layer 53. Thus, a metallic film (such as the seed layer 100) may be formed uniformly for example by sputtering on the top surface 53A of the first insulating layer 53. This may make the seed layer 100 thinner than the seed layer 100 formed on a roughened surface. Additionally, the top surface 53A of the first insulating layer 53 is a smooth surface with small recesses and projections. This may suppress the occurrence of residues during removal of a seed layer by etching, compared to the case where the top surface 53A of the first insulating layer 53 is a roughed surface with large recesses and projections. As a result, efforts to make wiring layers finer to be piled over the top surface 53A of the first insulating layer 53 may be fulfilled easily.

The second wiring layer 71 is formed on the first vias 64. The second wiring layer 71 fills in the recessed parts 64X of the first vias 64 to be connected to the first vias 64. The second wiring layer 71 has the top surface 71A having greater flatness than that of the end surfaces 64A of the first vias 64. Thus, the second vias 75 and the second wiring layer 71 (first vias 64) may be connected with a high degree of reliability, compared to the case where the second vias 75 are directly connected to the end surfaces 64A of the first vias 64. This allows the second vias 75 to be stacked suitably directly above the first vias 64 through the second wiring layer 71, thereby encouraging increase of a wiring density. As a result, efforts to make the wiring layer 72 on the second vias 75 fine may be fulfilled easily. Additionally, the wiring layer 72 on the second vias 75 may be placed with a high degree of flexibility, compared to the case where the second vias 75 do not have a stacked via structure, specifically where the second vias 75 are formed in positions not overlapping the end surfaces 64A of the first vias 64 in plan view.

(2) A wiring board having vias of a stacked via structure encounters a problem in that a crack is likely to occur at a boundary between a via and an insulating layer. This crack is considered to result from the reasons detailed as follows. In a structure where multiple vias of substantially the same diameter are stacked, the vias are piled in a linear pattern in a direction where layers of the wiring board are piled and boundaries between the vias and insulating layers are also arranged in a linear pattern in the direction where the layers of the wiring board are piled. Specifically, this structure finds difficulty in relieving thermal stress to be caused by a difference in coefficient of linear expansion between a via and an insulating layer. Accordingly, a crack is considered to occur easily at a boundary between a via and an insulating layer and particularly, at a boundary between the bottom of the via and the insulating layer. This crack may become a cause for peel-off at the bottom of a via.

In contrast, in the wiring board 10 of this embodiment, the second vias 75 smaller in diameter than the first vias 64 are piled directly above the first vias 64. This forms boundaries between the second vias 75 and the second insulating layer 81 in positions in a plane shifted from the positions of boundaries between the first vias 64 and the first insulating layer 53. Specifically, the first vias 64 and the second vias 75 are piled in the direction where the layers of the wiring board 10 are piled while the boundaries between the first vias 64 and the first insulating layer 53 are shifted in plan view from the boundaries between the second vias 75 and the second insulating layer 81. For example, according to the first vias 64 and the second vias 75 of the stacked via structure of this example, the boundaries between the first vias 64 and the first insulating layer 53 and the boundaries between the second vias 75 and the second insulating layer 81 are not arranged in a linear pattern in the direction where the layers of the wiring board 10 are piled. This may disperse thermal stress to be caused by a difference in coefficient of linear expansion between the first vias 64 and the first insulating layer 53 and between the second vias 75 and the second insulating layer 81. This may suitably suppress concentration of thermal stress on parts of the first vias 64 and the second vias 75 (such as the bottoms of the second vias 75), so that the occurrence of a crack may be suppressed suitably at the boundaries between the first vias 64 and the first insulating layer 53 and at the boundaries between the second vias 75 and the second insulating layer 81.

(3) The second insulating layer 81 is formed to cover the second wiring layer 71 with the flat top surface 71A. The second via holes VH7 smaller in diameter than the first via holes VH6 are formed in the second insulating layer 81 by photolithography. The second insulating layer 81 is formed on the flat top surface 71A of the second wiring layer 71. Thus, the second via holes VH7 of a small diameter may be formed with a high degree of accuracy in the second insulating layer 81.

(4) The first via holes VH6 formed in the first insulating layer 53 have roughened inner surfaces. This may increase a contact area between the first vias 64 and the first insulating layer 53, compared to the case where the first via holes VH6 have smooth inner surfaces. This enhances adhesion between the first vias 64 and the first insulating layer 53, thereby increasing resistance to tensile force resulting from a difference in coefficient of linear expansion between the first vias 64 and the first insulating layer 53. As a result, the first vias 64 and the first insulating layer 53 may be connected with a high degree of reliability, and coming off of the first vias 64 from the first via holes VH6 may be suppressed.

It should be apparent to those skilled in the art that the present invention may be embodied in many other specific forms without departing from the spirit or scope of the invention. Particularly, it should be understood that the present invention may be embodied in the following forms.

The respective shapes in cross section of the via holes including VH1, VH2, VH3, VH4, VH5, VH6, VH7, VH8 and VH9, and the respective shapes of the vias including V1, V2, V3, V4, V5, 64, 75, 76 and 77, are not specifically limited but they may be substantially rectangular (straight).

In the aforementioned embodiment, the entire top surface 71A of the second wiring layer 71 is formed to be parallel to the top surface 53A of the first insulating layer 53. However, this is not the only shape of the top surface 71A of the second wiring layer 71.

Figure 15:
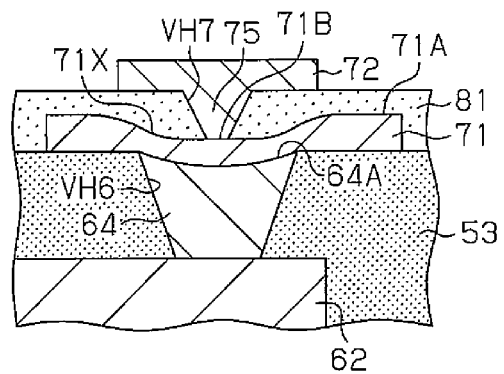
FIG. 15 is a cross sectional view illustrating part of a wiring board according to a first modification in an enlarged manner.

As depicted in FIG. 15, as long as a face 71B being part of the top surface 71A of the second wiring layer 71 and connected to the second via 75 has greater flatness than that of the end surfaces 64A of the first vias 64, the top surface 71A of the second wiring layer 71 may include a recessed part 71X dented toward the first wiring layer 62, for example. Effect similar to the effect (1) of the aforementioned embodiment may be achieved as long as part of the top surface of the second wiring layer 71 (specifically, the face 71B) connected to the second via 75 has greater flatness than that of the end surfaces 64A of the first vias 64.

Figure 16:
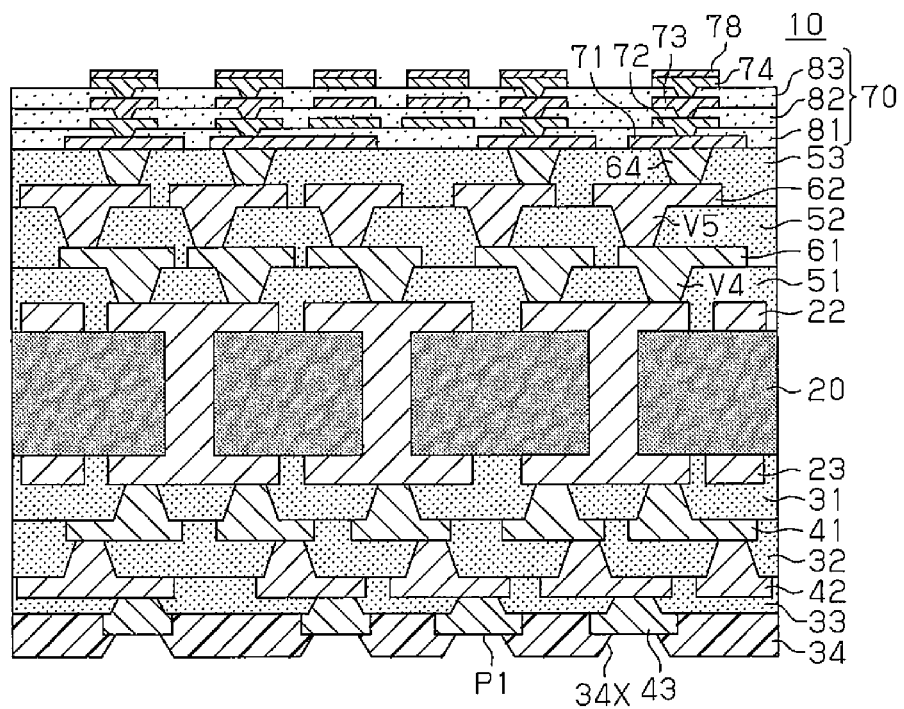
FIG. 16 is a cross sectional view illustrating an outline of a wiring board according to a second modification.

As depicted in FIG. 16, a metallic layer 78 may be formed on the outermost wiring layer 74. Examples of the metallic layer 78 include a metallic layer with an Ni layer and an Au layer piled in this order from the top surface of the outermost wiring layer 74, a metallic layer with an Ni layer, a Pd layer, and an Au layer piled in this order from the top surface of the outermost wiring layer 74, a metallic layer with an Ni layer, a Pd layer, and an Ag layer piled in this order from the top surface of the outermost wiring layer 74, and a metallic layer with an Ni layer, a Pd layer, an Ag layer, and an Au layer piled in this order from the top surface of the outermost wiring layer 74. These Ni, Au, Pd, and Ag layers may each be a metallic layer (electroless plated metallic layer) formed by electroless plating, for example.

An OSP film may be formed on the outermost wiring layer 74.

The respective numbers of the wiring layers 41, 42, 43, 61 and 62 and those of the insulating layers 31, 32, 33, 51, 52 and 53, and wiring layout of these layers may be changed in various ways in the wiring board 10.

In the fine wiring structure 70, the number of the wiring layers 71 to 74 and that of the insulating layers 81 to 83, and wiring layout of these layers may be changed in various ways. As an example, in the aforementioned embodiment, the vias 76 and the vias 77 piled above the wiring layer 72 are formed as vias of a stacked via structure. However, this is not the only example of the vias 76 and the vias 77. The vias 76 and the vias 77 may be arranged in positions not overlapping the second vias 75 in plan view, for example.

The fine wiring structure 70 is not always required to be formed above a buildup substrate with a core including the core substrate 20. The fine wiring structure 70 may be formed above any substrate such as a coreless substrate with no core substrate.

The fine wiring structure 70 of the wiring board 10 may include a plurality of semiconductor chip-mounting sections.

The disclosure further encompasses various example(s) described below.

[Clause 1] According to one embodiment, a method of manufacturing a wiring board (10) includes: forming a first insulating layer (53) so as to cover a first wiring layer (62); forming a first via hole (VH6) in an outer surface (53A) of the first insulating layer (53), an outer surface of the first wiring layer (62) being exposed through the first via hole (VH6); forming a conductive layer to fill in the first via hole (VH6) and to cover the outer surface (53A) of the first insulating layer (53); smoothing the outer surface (53A) of the first insulating layer (53) by polishing the conductive layer covering the outer surface (53A) of the first insulating layer (53) and polishing the outer surface (53A) of the first insulating layer (53), the polishing including forming a first via (64) by making the conductive layer fill in the first via hole (VH6), the first via (64) including an end surface (64A) exposed at the outer surface (53A) of the first insulating layer (53), the end surface (64A) including a recessed part (64X) dented toward the first wiring layer (62); filling in the recessed part (64X) by forming a second wiring layer (71) on the outer surface (53A) of the first insulating layer (53) and the end surface (64A) of the first via (64), the second wiring layer (71) having an outer surface (71A) of greater flatness than that of the end surface (64A) of the first via (64); forming a second insulating layer (81) on the outer surface (53A) of the first insulating layer (53) to cover the second wiring layer (71); forming a second via hole (VH7) in an outer surface (81A) of the second insulating layer (81) and directly above the first via hole (VH6), the outer surface (71A) of the second wiring layer (71) being exposed through the second via hole (VH7), the second via hole (VH7) being smaller in diameter than the first via hole (VH6); and forming a second via (75) to fill in the second via hole (VH7), the second via (75) being connected to the second wiring layer (71).

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although embodiments of the present invention have been described in detail, it should be understood that various changes, substitutions, and alterations could be made hereto without departing from the spirit and scope of the invention.

What is claimed is:

1. A wiring board comprising:
    a first wiring layer;
    a first insulating layer covering the first wiring layer;
    a first via hole having an opening in an outer surface of the first insulating layer, an outer surface of the first wiring layer being exposed through the first via hole;
    a first via filling in the first via hole, the first via including an end surface exposed at the outer surface of the first insulating layer;
    a second wiring layer arranged on the outer surface of the first insulating layer and the end surface of the first via;
    a second insulating layer covering the second wiring layer;
    a second via hole having an opening in an outer surface of the second insulating layer, the outer surface of the second wiring layer being exposed through the second via hole; and
    a second via filling in the second via hole, the second via being smaller in diameter than the first via, the second via being arranged above the first via through the second wiring layer,
    wherein the entire second via hole overlaps the first via hole in plan view, the second insulating layer is thinner than the first insulating layer and the second wiring layer is thinner than the first wiring layer, the end surface of the first via includes a recessed part dented toward the first wiring layer, with the second wiring layer filling the recessed part, and the second wiring layer that is located above the end surface of the first via includes a top surface having greater flatness than that of the end surface of the first via.

2. The wiring board according to claim 1, wherein the second via has a central axis substantially coincides with a central axis of the first via.

3. The wiring board according to claim 1, wherein the second via has a diameter of half or less of a diameter of the first via.

4. The wiring board according to claim 1, wherein the second wiring layer is finer than the first wiring layer and the second wiring layer has a line-to-space ratio of 5 µm and 5 µm or less.

5. The wiring board according to claim 1, wherein the second insulating layer is made of a material different from a material for the first insulating layer and the material for the second insulating layer includes a photosensitive resin material.

6. The wiring board according to claim 1, wherein the second wiring layer is the same in thickness as the second insulating layer or thinner than the second insulating layer.

7. The wiring board according to claim 1, wherein the first via includes a side surface that contacts the inner surface of the first via hole and the outer surface of the first insulating layer is lower in surface roughness than the side surface of the first via.

8. The wiring board according to claim 1, wherein the first wiring layer has a first wiring density while the second wiring layer has a second wiring density higher than the first wiring density.

9. A semiconductor device comprising:

the wiring board according to claim 1, the wiring board including a fine wiring structure with the second wiring layer, the second insulating layer, and an outermost wiring layer; and a semiconductor chip flip-chip mounted on the outermost wiring layer of the fine wiring structure.

10. The wiring board according to claim 1, wherein the second via has a diameter of half or less of a diameter of the first via, and the second via has a depth of half or less of a depth of the first via.

11. The wiring board according to claim 1, wherein the second wiring layer includes a seed layer and an electrolytic plated layer on the seed layer, with the seed layer covering and directly contacting the end surface of the first via.

12. The wiring board according to claim 1, wherein the outer surface of the first insulating layer and the end surface of the first via are polished surfaces, with the outer surface of the first insulating layer having a surface roughness lower than that of an inner surface of the first via hole.

* * * * *